United States Patent
Ker et al.

(10) Patent No.: US 6,465,848 B2
(45) Date of Patent: Oct. 15, 2002

(54) LOW-VOLTAGE-TRIGGERED ELECTROSTATIC DISCHARGE PROTECTION DEVICE AND RELEVANT CIRCUITRY

(75) Inventors: Ming-Dou Ker, Hsinchu; Geeng-Lih Lin, Hsinchu Hsien, both of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/851,973

(22) Filed: May 10, 2001

(65) Prior Publication Data

US 2002/0050615 A1 May 2, 2002

(30) Foreign Application Priority Data

Oct. 27, 2000 (TW) ........................................ 89122666 A

(51) Int. Cl.[7] ........................... H01L 21/94; H01L 23/62
(52) U.S. Cl. ...................... 257/355; 257/335; 257/361; 257/362
(58) Field of Search ................................ 438/133, 134, 438/323, 324, 202, 201; 257/107, 173, 355, 361, 362, 335

(56) References Cited

U.S. PATENT DOCUMENTS

| | | | | |
|---|---|---|---|---|
| 5,012,317 A | * | 4/1991 | Rountre | 257/154 |
| 5,453,384 A | * | 9/1995 | Chatterjee | 257/107 |
| 5,455,436 A | * | 10/1995 | Cheng | 257/356 |
| 5,576,557 A | * | 11/1996 | Ker et al. | 257/141 |
| 5,682,047 A | * | 10/1997 | Consiglio et al. | 257/133 |
| 5,754,380 A | * | 5/1998 | Ker et al. | 361/111 |
| 5,959,820 A | * | 9/1999 | Ker et al. | 361/111 |
| 5,959,821 A | * | 9/1999 | Voogel | 361/111 |
| 6,066,879 A | * | 5/2000 | Lee et al. | 257/355 |
| 6,242,763 B1 | * | 6/2001 | Chen et al. | 257/107 |
| 6,323,074 B1 | * | 11/2001 | Jiang et al. | 438/201 |
| 6,358,781 B1 | * | 3/2002 | Lee et al. | 257/107 |
| 2002/0042195 A1 | * | 4/2002 | Miaw | 438/621 |
| 2002/0053704 A1 | * | 5/2002 | Avery et al. | 257/361 |

* cited by examiner

*Primary Examiner*—Michael S. Lebentritt
(74) *Attorney, Agent, or Firm*—Intellectual Property Solutions, PLLC

(57) ABSTRACT

A novel low-voltage-triggered semiconductor controlled rectified (LVTSCR) as an ESD protection device is provided in this invention. The ESD protection device of the present invention has a lateral SCR (LSCR) structure with two electrodes and a MOS for triggering the LSCR. A dummy gate and a doped region are used to isolate the MOS from one of these two electrodes. The dummy gate is designed to block the formation of field-oxide layer formed in the device structure of the lateral SCR. Therefore, the proposed SCR device has a shorter current path in CMOS process, especially in the CMOS process with shallow trench isolation (STI) field-oxide layer. During an ESD, the current path in the ESD protection device is much shorter, and the turn-on speed and the ESD tolerance level are thereby enhanced.

24 Claims, 6 Drawing Sheets

LOW-VOLTAGE-TRIGGERED ELECTROSTATIC DISCHARGE PROTECTION DEVICE AND RELEVANT CIRCUITRY

BACKGROUND OF THE INVENTION

1. Field of the Invention

The present invention relates to a low voltage triggered electrostatic discharge (ESD) protection device and its applications. In particular, the present invention relates to a modified lateral silicon controlled rectifier especially suited to the process of shallow trench isolation (STI).

2. Description of the Related Art

As the semiconductor manufacturing process develops, ESD protection has become one of the most critical reliability issues for integrated circuits (IC). In particular, as semiconductor process advances into the deep sub-micron stage, scaled-down devices and thinner gate oxides are more vulnerable in terms of ESD stress. Thus, the input/output ports on IC chips are usually designed to include ESD protect devices or circuits for protecting the devices in IC chips from ESD damage.

FIG. 1 shows a cross-section view of a conventional Low-Voltage-Triggered lateral Semiconductor Control Rectifier (LVTSCR), triggered by an NMOS. The LVTSCR in FIG. 1 is constructed by a lateral SCR (LSCR) composed of P+ region 14, N well 10, P substrate 12 and N+ region 16, and an NMOS composed of a gate 20, a drain of N+ region 18 and a source of N+ region 16. In FIG. 1, P+ region 14 and N+ region 16 are respectively used the anode and the cathode of the LVTSCR. NMOS is used to lower the trigger voltage of the LSCR, such that the combined device is named LVTSCR. While an LVTSCR is implemented by a process flow with a conventional field oxide process, the doped regions in the surface of the substrate are isolated from each other by field oxide layers 26. The arrow and the dash line in FIG. 1 illustrates the ESD current path while the LVTSCR is triggered to release ESD stress. When positive ESD stress pulses on the anode of the LVTSCR in FIG. 1 and the cathode is relatively coupled to ground, the ESD current conducts from P+ region 14 (anode), detours under the field oxide 26, reaches N+ region 16, and is released to the coupled ground.

However, semiconductor process progress has begun to replace the field oxide layers in ICs with shallow trench isolation (STI) regions. FIG. 2 is a cross-section view of the LVTSCR in FIG. 1 wherein the field oxide layers 26 in FIG. 1 are replaced by STI regions 30. One of the strongest advantages of employing the STI process in an IC is that the substrate surface of the IC will become more even, and the subsequent electric connections are more easily fabricated on the substrate surface. To perform electrical isolation between devices, however, STI regions require a certain depth, usually deeper than that of a diffusion region, as shown in FIG. 2. When a positive ESD stress pulses on the anode of the LVTSCR in FIG. 2 and the cathode is relatively coupled to ground, the ESD current conducts from P+ region 14 (anode), detours under the STI region 30, reaches N+ region 16, and is released to the coupled ground. The ESD current path in FIG. 2, in comparison with that in FIG. 1, is distinctly longer due to the increased depth of the STI region 30.

Therefore, it is more difficult for the ESD current path in FIG. 2 to release ESD stress than in FIG. 1, such that the LVTSCR in FIG. 2 has a longer turn-on time and a lower ESD tolerance. Thus, replacing field-oxide structure with STI structure may degrade the ESD tolerance of an ESD protection device.

SUMMARY OF THE INVENTION

An object of the present invention is to provide an ESD protection device having a quick turn-on speed and superior ESD tolerance even though the ESD protection device is fabricated with the STI process.

Another object of the present invention is to provide ESD protection circuits employing the ESD protection device of the present invention.

As mentioned above, the ESD protection device of the present invention comprises a first well of a first conductive type, a second well of a second conductive type, a MOS of the first conductive type, a first doped region of the second conductive type, a second doped region of the first conductive type and a dummy gate. The second conductive type is opposite to the first conductive type. The second well contacts the first well to form a junction. The MOS comprises a control gate, a first drain/source region of the first conductive type and a second drain/source region of the first conductive type. The control gate is positioned on the second well. The first drain/source region is formed on the junction. The second drain/source region is formed on the second well and coupled to a first pad. The first doped region is coupled to a second pad and formed on the first well. The first doped region associates with the first well, the second well and the second drain/source region to construct a lateral semiconductor controlled rectifier (LSCR). The second doped region is formed on the surface of the well and between the first doped region and the first drain/source region. The dummy gate is positioned between the first drain/source region and the second doped region and on the first well.

The LSCR has an anode and a cathode respectively coupled to a first pad and a second pad.

The ESD protection device of the present invention has the advantage of quicker turn-on speed and higher ESD tolerance, in comparison with the prior art, since no STI structure stands between the anode and the cathode to lengthen the ESD current path.

BRIEF DESCRIPTION OF THE DRAWINGS

The present invention can be more fully understood by reading the subsequent detailed description in conjunction with the examples and references made to the accompanying drawings, wherein:

FIG. 3b is the symbol denoting the NMOS-triggered LVTSCR in FIG. 3a;

FIG. 4b is the symbol denoting the PMOS-triggered LVTSCR in FIG. 4a;

FIG. 5b is an embodiment of the ESD protection circuit in FIG. 5a;

FIG. 6b is an embodiment of FIG. 6a;

FIG. 7b is an embodiment of the VDD-to-VSS ESD protection circuit in FIG. 7a;

FIG. 7a is a VDD-to-VSS ESD protection circuit employing the pSCR of the present invention; and FIG. 8b is an embodiment of the VDD-to-VSS ESD protection circuit in FIG. 8a.

DETAILED DESCRIPTION OF THE PREFERRED EMBODIMENT

The essence of the present invention is to replace the STI region through which the ESD current must detour in the prior art with a dummy gate structure. The dummy gate structure provides sufficient isolation to separate doped (diffusion) regions. Additionally, the dummy gate does not lengthen the ESD current path. The turn-on speed and the ESD tolerance level of the present invention are thus enhanced.

Figure 1:
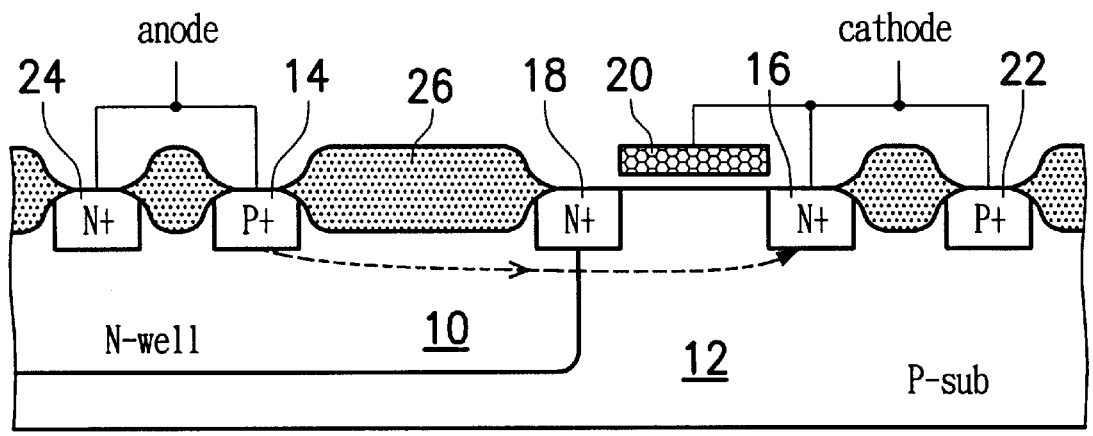
FIG. 1 shows a cross-section view of a conventional Low Voltage Triggered lateral Semiconductor Control Rectifier (LVTSCR)
Figure 2:
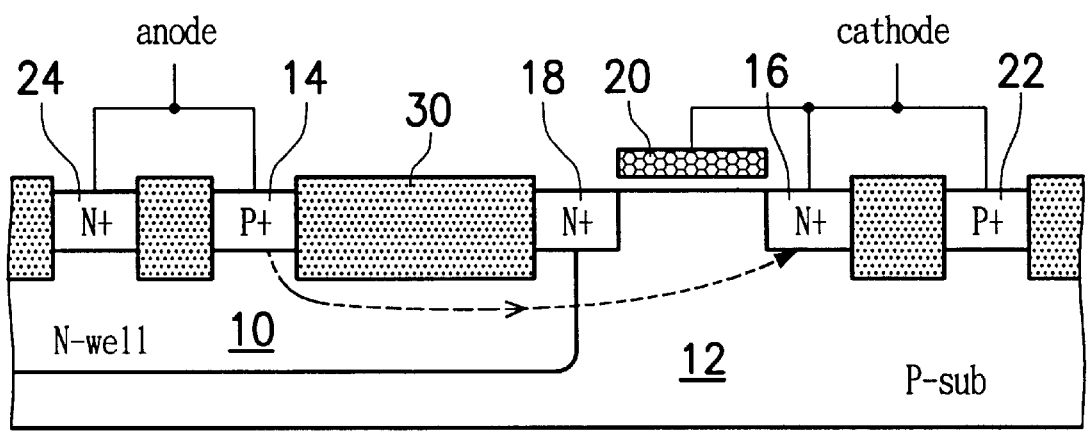
FIG. 2 is a cross-section view of the LVTSCR in FIG. 1 wherein the field oxide layers in FIG. 1 are replaced by STI regions.
Figure 3A:
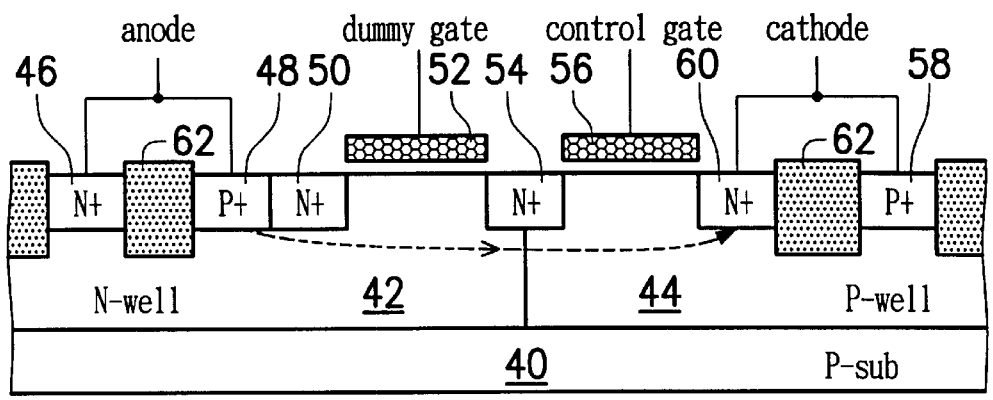
FIG. 3a shows a cross-section view of an NMOS-triggered LVTSCR according to the present invention.
Figure 3B:
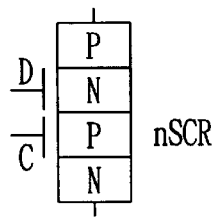

FIG. 3a shows a cross-section view of an NMOS-triggered LVTSCR according to the present invention. FIG. 3b is the symbol denoting the NMOS-triggered LVTSCR in FIG. 3a. The NMOS-triggered LVTSCR, named nSCR in short, in FIG. 3a is formed on a P substrate 40 and has an N well 42 and a P well 44 adjacent to each other.

A P+ region 58 formed in the P well 44 is used as an electric contact for the P well 44. The NMOS for triggering the nSCR is also positioned on the P well 44. The NMOS has a control gate 56 and two N+ region (60 and 54), where N+ regions 60 and 54 respectively are the source and the drain of the NMOS. N+ region 54 is located on the junction formed by the contact between P well 44 and the N well 42. N+ region 60 is isolated from P+ region 58 by a STI region 62.

There is an N+ region 46 used as an electric contact for the N well 42. P+ region 48 in the N well 42 is isolated from N+ region 46 by a STI region 62. Dummy gate 52 and N+ region 46 are located in the N well 42 to separate the P+ region 48 from N+ region 54. Both the STI structure and field oxide are isolated from the ESD current path (the arrow and the dash line in FIG. 3a) so the length of the ESD current path is shorter than that in the prior art, such that the nSCR according to the present invention has a quicker turn-on speed and a better ESD tolerance level.

As shown in FIG. 3a, P+ region 48, N well 42, P well 44 and N+ region 60 construct a lateral SCR. Where N well 42 and P+ region 48 are coupled together as an anode and P well 44 and N+ region 60 are coupled together as a cathode. FIG. 3b illustrates the symbol of the nSCR. Furthermore, in FIG. 3b, the letter "C" beside a P layer indicates that the control gate 56 is on P well 44. The letter "D" beside an N layer indicates that the dummy gate 52 is on N well 42.

The control gate 56 of the NMOS can be coupled to an ESD detection circuit. The ESD detection circuit is responsive to an ESD event. When the ESD detection circuit detects an ESD, it drives the control gate 56 to trigger on the nSCR to release ESD stress.

The dummy gate 52 can function in an electrically floating state (coupled to nothing) or can be coupled to VDD or VSS. Neither condition will influence the ESD current path in the nSCR.

Figure 4A:
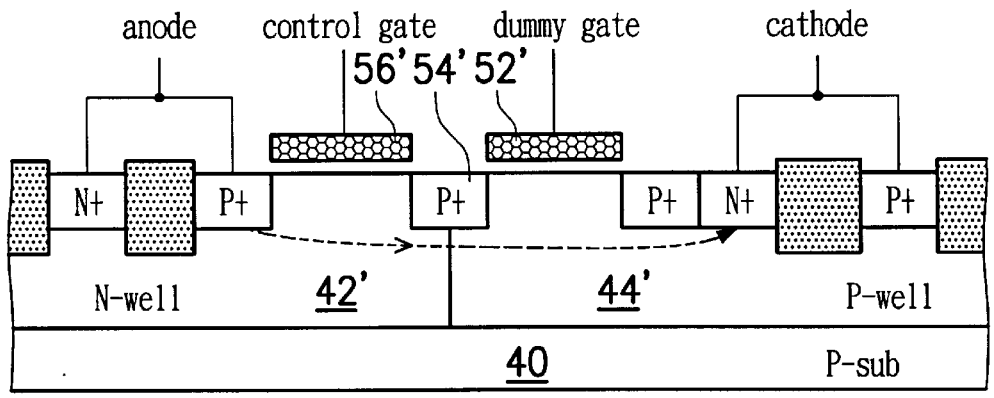
FIG. 4a shows a cross-section view of a PMOS-triggered LVTSCR according to the present invention.
Figure 4B:
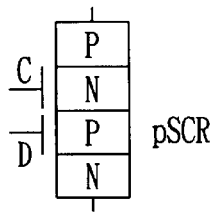

By employing the same concept, a cross-section view of a PMOS-triggered LVTSCR, named pSCR in short, according to the present invention is shown in FIG. 4a. A control gate 56' is located on N well 42' and a dummy gate 52' is located on P well 44'. The corresponding symbol of the pSCR in FIG. 4a is shown in FIG. 4b, where "C" denotes the control gate and "D" denotes the dummy gate. As shown by the arrow and the dash line in FIG. 4a, ESD current flows from the anode to the cathode without approaching any STI structure or field oxide structure.

P substrate 40 in FIG. 3a or FIG. 4a can be replaced by an N substrate without any functional impact on the nSCR or pSCR according to the present invention. Furthermore, the present invention is further suitable to SOI (silicon on insulator) structure, in which an insulator layer is put under N well (42 or 42') and P well (44 or 44') to prevent interference between wells.

Figure 5A:
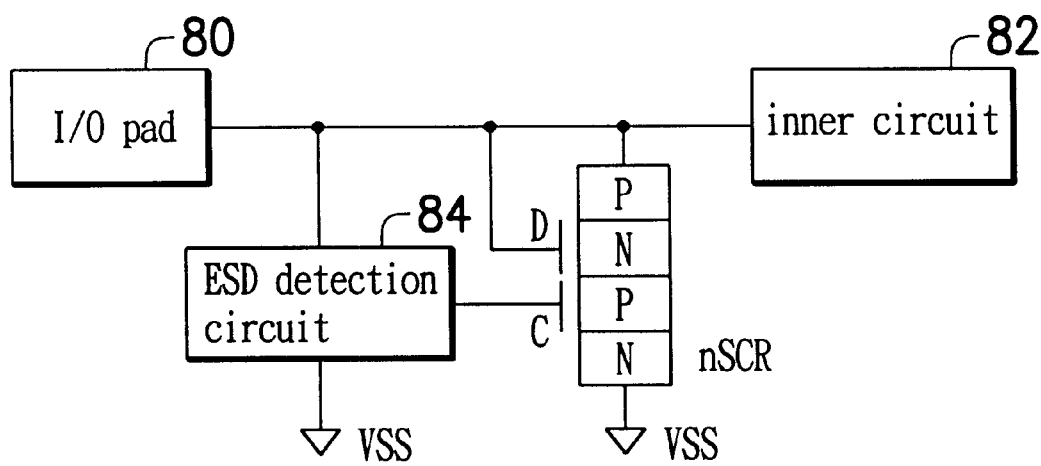
FIG. 5a is an ESD protection circuit according to the invention.
Figure 5B:
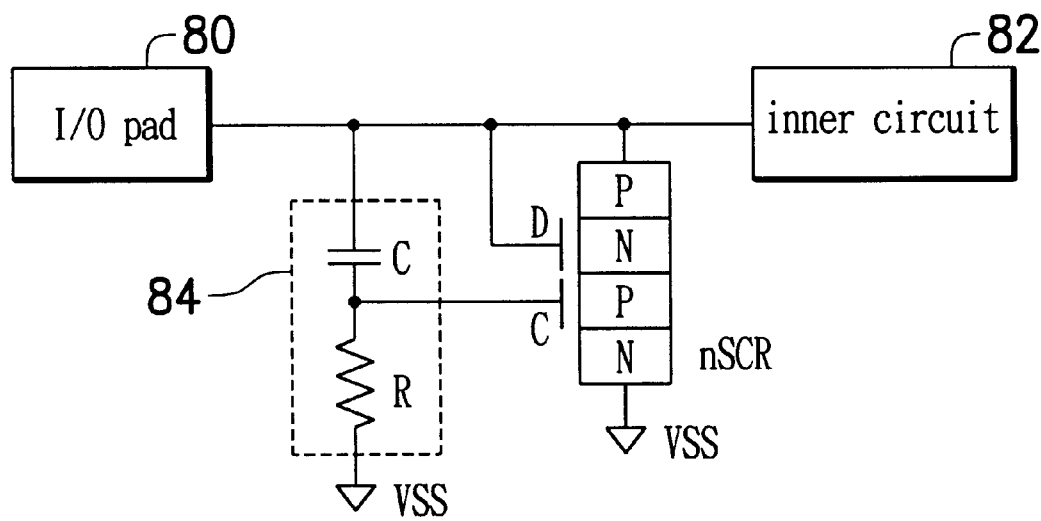

FIG. 5a is an ESD protection circuit according to the invention. The cathode of the nSCR of the present invention is coupled to VSS. The anode and the dummy gate of the nSCR are coupled to an I/O (input/output) pad 80. ESD detection circuit 84 is responsible for detecting if an ESD event occurring across the I/O pad 80 and VSS. When an ESD event is occurring across the I/O pad 80 and VSS, the ESD detection circuit 84 temporally drives the control gate to a relative voltage level to trigger the turn-on of the nSCR and conduct ESD current, and the inner circuit 82 is protected. FIG. 5b is an embodiment of the ESD protection circuit in FIG. 5a. A RC-coupled circuit, having a resistor and a capacitor connected in series, composes an ESD detection circuit 84. The control gate is coupled to the connection node between the capacitor C and the resistor R.

Figure 6A:
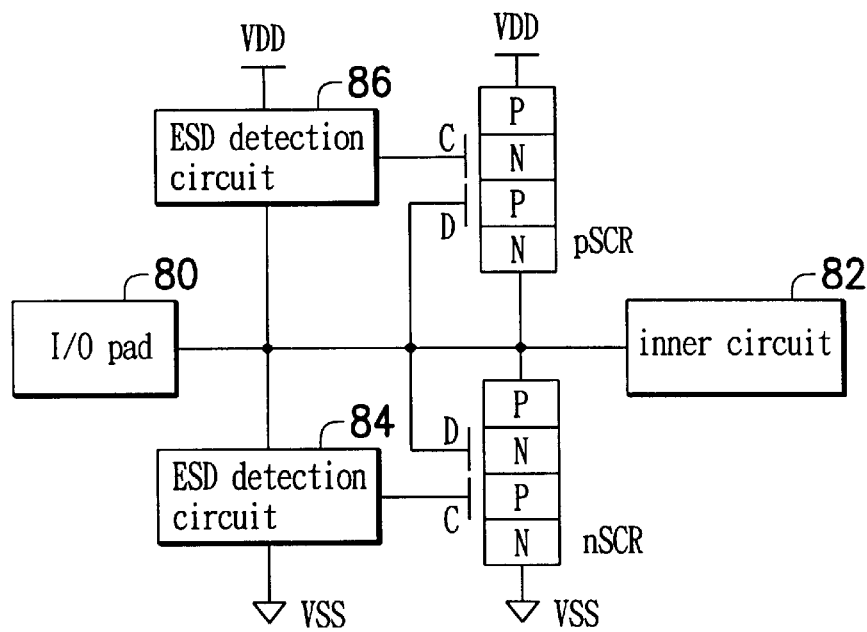
FIG. 6a shows two ESD protection circuits according to the present invention, wherein one is applied between the I/O pad and VSS and the other is applied between VDD and the I/O pad.
Figure 6B:
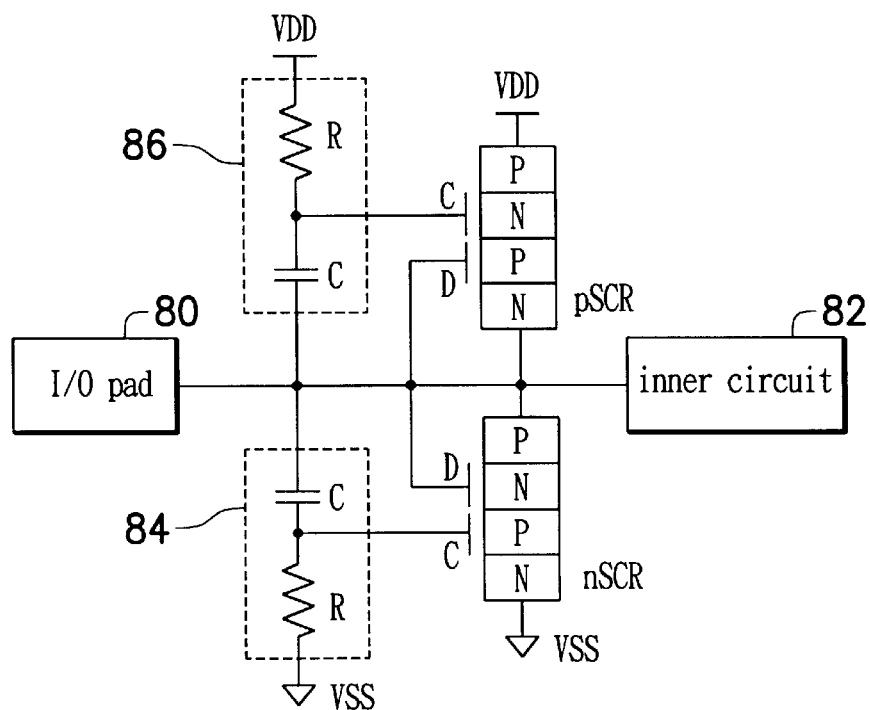

As well as protection against ESD stress across the I/O pad and VSS, the present invention also can be applied to protect the inner circuits against ESD stress across the VDD and I/O pad, as shown in FIG. 6a. FIG. 6a shows two ESD protection circuits according to the present invention, wherein one is applied between the I/O pad and VSS and the other is applied between VDD and the I/O pad. The ESD protection circuit between the I/O pad 80 and VDD includes an ESD detection circuit 86 and a PSCR. The anode of the PSCR is coupled to VDD. The dummy gate and the cathode of the pSCR are coupled to the I/O pad 80. The ESD detection circuit 86 is responsible for driving the control gate of the PSCR. While an ESD event is occurring across VDD and the I/O pad 80, the ESD detection circuit 86 will drive the control gate to a relative-low voltage to trigger the pSCR and conduct ESD current, thereby ESD stress is released and the inner circuit 82 is protected. FIG. 6b is an embodiment of FIG. 6a. The ESD detection circuit 86 is composed of a resistor and a capacitor connected in series. The control gate of the pSCR is coupled to the connection node between the resistor and the capacitor in the ESD detection circuit 86.

Figure 7A:
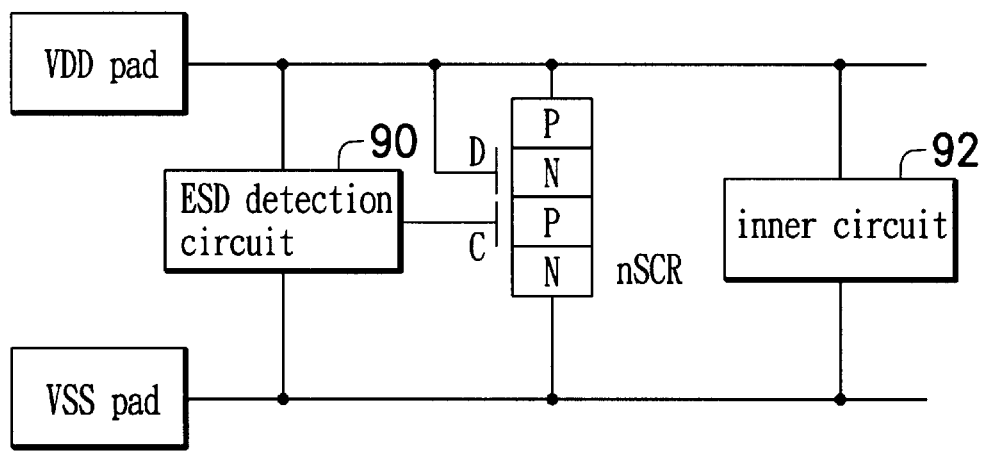
FIG. 7a is a VDD-to-VSS ESD protection circuit employing the nSCR of the present invention.
Figure 7B:
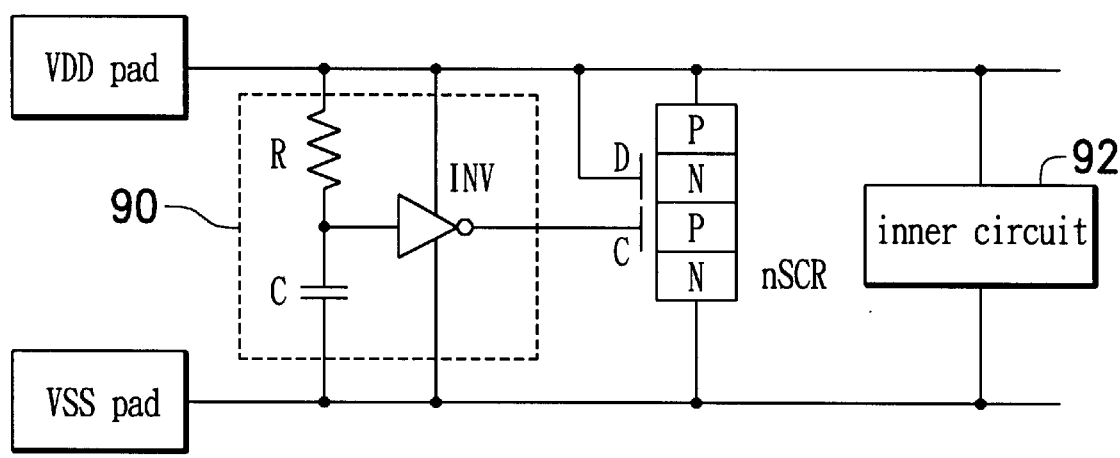

The present invention also provides an ESD protection circuit for protecting an IC from ESD damage due to ESD events across power rails. FIG. 7a is a VDD-to-VSS ESD protection circuit employing the nSCR of the present invention. FIG. 7b is an embodiment of the VDD-to-VSS ESD protection circuit in FIG. 7a. The anode and the dummy gate of the nSCR in FIG. 7a are coupled to VDD. The cathode of the nSCR is coupled to VSS. ESD detection circuit 90 is composed of an RC-base circuit and an inverter. The RC-base circuit is composed of a resistor and a capacitor connected in series and normally carries a time constant of about 0.1–1 microsecond to distinguish an ESD event from normal operation. The input of the inverter INV is connected to the connection node in the RC-base circuit while the output of the inverter INV is connected to the control gate of the nSCR. When a positive ESD pulse crosses the VDD and VSS is grounded, due to the RC time delay effect, the input of the inverter is temporally kept at a relatively low voltage to cause the inverter INV driving the control gate to a relative high voltage, such that the nSCR is triggered on to release ESD stress.

Figure 8A:
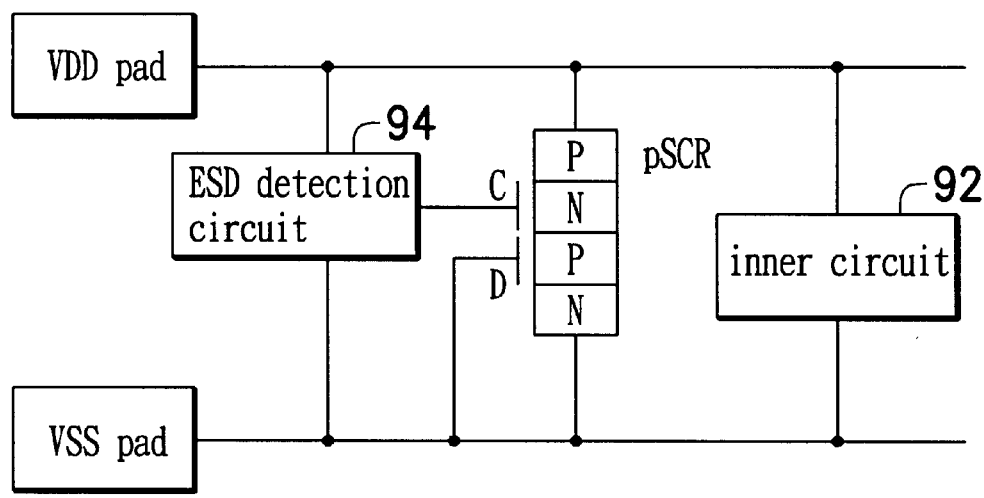
Figure 8B:
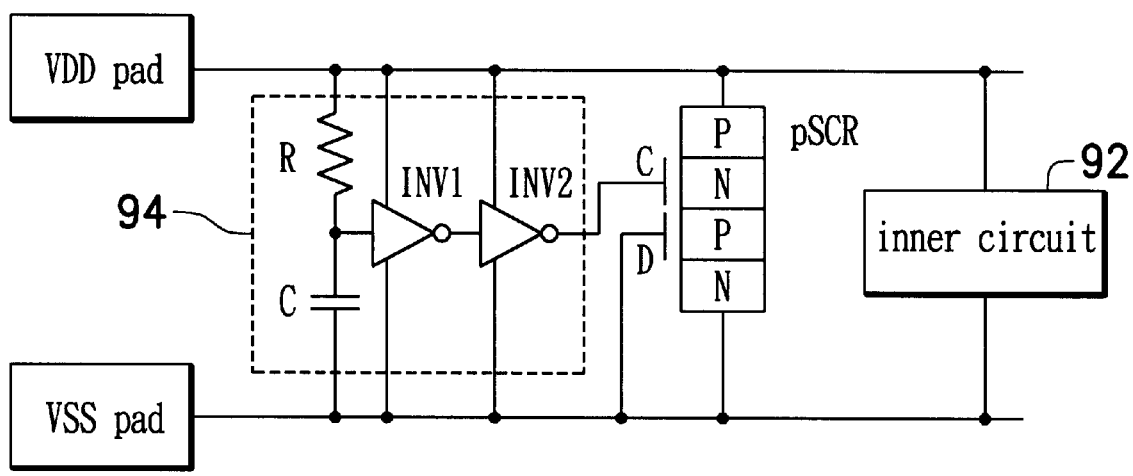

The PSCR of the present invention can also be applied to be a major ESD protection device in a VDD-to-VSS ESD protection circuit, as shown in FIG. 8a. FIG. 8b is an embodiment of the VDD-to-VSS ESD protection circuit in FIG. 8a. The anode of the pSCR of the present invention is coupled to VDD. The cathode and the dummy gate of the pSCR are coupled to VSS. The ESD detection circuit 94 is composed of an RC-base circuit and two cascade inverters (INV1 and INV2). The RC-base circuit has a resistor and a capacitor connected in series and normally carries a time constant of about 0.1 to 1 microsecond. In FIG. 8b, two cascade inverters INV1 and INV2 are used as an amplifier to drive the control gate of the pSCR according to the voltage at the connection node between the resistor R and the capacitor C. Finally, while the invention has been described by way of examples and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge protection device, comprising:
    a first well of a first conductive type;
    a second well of a second conductive type opposite to the first conductive type, contacting with the first well to form a junction;
    a MOS of the first conductive type, comprising:
        a control gate, positioned on the second well;
        a first drain/source region of the first conductive type, formed on the junction; and
        a second drain/source region of the first conductive type, formed on the second well and coupled to a first pad;
    a first doped region of the second conductive type, coupled to a second pad, formed on the first well and associated with the first well, the second well and the second drain/source region to construct a lateral semiconductor controlled rectifier (LSCR);
    a second doped region of the first conductive type, formed on the surface of the well and between the first doped region and the first drain/source region; and
    a dummy gate, positioned between the first drain/source region and the second doped region and on the first well.

2. The ESD protection device as claimed in claim 1, wherein, the first well and the second well are formed on a common substrate.

3. The ESD protection device as claimed in claim 2, wherein, the common substrate is a first semiconductor layer of the first conductive type, a second semiconductor layer of the second conductive type or an isolating layer.

4. The ESD protection device as claimed in claim 1, wherein the ESD protection device further comprises a first contact region of the first conductive type, formed on the first well and coupled to the second pad.

5. The ESD protection device as claimed in claim 4, wherein a shallow trench isolation region is formed on the surface of the first well to separate the first contact region from the second doped region.

6. The ESD protection device as claimed in claim 1, wherein the ESD protection device further comprises a second contact region of the second conductive type, formed on the second well and coupled to the first pad.

7. The ESD protection device as claimed in claim 6, wherein a shallow trench isolation region is formed on the surface of the second well to separate the second contact region from the second drain/source region.

8. The ESD protection device as claimed in claim 1, wherein the dummy gate is electrically floated, coupled to the first pad, or coupled to the second pad.

9. The ESD protection device as claimed in claim 1, wherein, while an ESD event is occurring across the first pad and the second pad, an ESD detection circuit drives the control gate to trigger on the LSCR to conduct ESD current.

10. The ESD protection device as claimed in claim 1, wherein the first conductive type is N type and the second conductive type is P type.

11. The ESD protection device as claimed in claim 1, wherein the first conductive type is P type and the second conductive type is N type.

12. An ESD protection circuit, coupled between a first pad and
    a second pad, comprising:
    a low voltage triggered semiconductor controlled rectifier, comprising:
        a first well of a first conductive type;
        a second well of a second conductive type opposite to the first conductive type, adjacent to the first well to form a junction;
    a MOS of the first conductive type, comprising:
        a control gate, positioned on the second well;
        a first drain/source region of the first conductive type, formed on the junction; and
        a second drain/source region of the first conductive type, formed on the second well, used as a first electrode and coupled to the first pad;
    a first doped region of the second conductive type, formed on the first well as a second electrode, coupled to the second pad, and associated with the first well, the second well and the second drain/source region to construct a lateral semiconductor controlled rectifier (LSCR);
    a second doped region of the first conductivity, formed on the first well and between the first doped region and the first doped region; and
    a dummy gate, formed on the first well and between the second doped region and the first drain/source region; and
    an ESD detection circuit for driving, while an ESD event occurring across the first pad and the second pad is detected, the control gate to trigger the LSCR and conduct ESD current.

13. The ESD protection circuit as claimed in claim 12, wherein the first conductivity type is N type and the second conductivity type is P type.

14. The ESD protection circuit as claimed in claim 13, wherein the second pad is an input/output pad and the first pad is a relative-low power pad.

15. The ESD protection circuit as claimed in claim 13, wherein the first pad is an input/output pad and the second pad is a relative-high power pad.

16. The ESD protection circuit as claimed in claim 12, wherein the ESD detection circuit has a RC-base circuit, coupled between the first pad and the second pad and comprising a resistor and a capacitor connected in series.

17. The ESD protection circuit as claimed in claim 16, wherein the control gate is directly coupled to a connection node of the RC-base circuit.

18. The ESD protection circuit as claimed in claim 16, wherein the ESD detection circuit further comprises a driver, having an input connected to a connection node of the RC-base circuit and an output for driving the control gate.

19. The ESD protection circuit as claimed in claim 17, wherein the driver is composed of an inverter.

20. The ESD protection circuit as claimed in claim 17, wherein the driver is composed of two cascade inverters.

21. The ESD protection circuit as claimed in claim 12, wherein the first conductivity type is P type and the second conductivity type is N type.

22. The ESD protection circuit as claimed in claim 21, wherein the first pad is an input/output pad and the second pad is a relative-low power pad.

23. The ESD protection circuit as claimed in claim 21, wherein the second pad is an input/output pad and the first pad is a relative-high power pad.

24. The ESD protection circuit as claimed in claim 21, wherein the second pad is an input/output pad and the first pad is a relative-high power pad.

* * * * *